US010026686B2

(12) United States Patent
Bou-Ghazale et al.

(10) Patent No.: US 10,026,686 B2
(45) Date of Patent: Jul. 17, 2018

(54) DECOUPLING CAPACITORS AND ARRANGEMENTS

(71) Applicant: Intel Corporation, Santa Clara, CA (US)

(72) Inventors: Silvio E. Bou-Ghazale, Hillsboro, OR (US); Rany T. Elsayed, Rancho Cordova, OR (US); Niti Goel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/125,964

(22) PCT Filed: Jun. 27, 2014

(86) PCT No.: PCT/US2014/044595
§ 371 (c)(1),
(2) Date: Sep. 13, 2016

(87) PCT Pub. No.: WO2015/199722
PCT Pub. Date: Dec. 30, 2015

(65) Prior Publication Data
US 2017/0148728 A1  May 25, 2017

(51) Int. Cl.
*H01L 27/07* (2006.01)
*H01L 23/522* (2006.01)
(Continued)

(52) U.S. Cl.
CPC ...... *H01L 23/5223* (2013.01); *H01L 27/0629* (2013.01); *H01L 27/0733* (2013.01); *H01L 28/88* (2013.01); *H01L 2924/0002* (2013.01)

(58) Field of Classification Search
CPC ... H01L 27/07; H01L 27/0711; H01L 27/075; H01L 27/0788
See application file for complete search history.

(56) References Cited

U.S. PATENT DOCUMENTS

| 2004/0062011 A1 | 4/2004 | Kinoshita |
| 2007/0075341 A1 | 4/2007 | Pan |

(Continued)

FOREIGN PATENT DOCUMENTS

| JP | 2004-119709 A | 4/2004 |
| JP | 2008-040220 A | 2/2008 |

(Continued)

OTHER PUBLICATIONS

Taiwan 2nd Office Action and Search Report, dated Dec. 13, 2016, issued in corresponding Taiwan Patent Application No. 104116074, 14 pages.

(Continued)

Primary Examiner — Cheung Lee
(74) Attorney, Agent, or Firm — Schwabe, Williamson & Wyatt, P.C.

(57) ABSTRACT

Various embodiments of transistor assemblies, integrated circuit devices, and related methods are disclosed herein. In some embodiments, a transistor assembly may include a base layer in which a transistor is disposed, a first metal layer, and a second metal layer disposed between the base layer and the first metal layer. The transistor assembly may also include a capacitor, including a sheet of conductive material with a channel therein, disposed in the base layer or the second metal layer and coupled to a supply line of the transistor. Other embodiments may be disclosed and/or claimed.

21 Claims, 8 Drawing Sheets

(51) Int. Cl.
   *H01L 27/06*       (2006.01)
   *H01L 49/02*       (2006.01)

(56) References Cited

U.S. PATENT DOCUMENTS

| | | |
|---|---|---|
| 2010/0078695 A1 | 4/2010 | Law et al. |
| 2013/0320458 A1 | 12/2013 | Deng et al. |
| 2014/0167172 A1 | 6/2014 | Chen et al. |
| 2014/0170832 A1* | 6/2014 | Sutardja .................. H01L 45/04 |
| | | 438/382 |

FOREIGN PATENT DOCUMENTS

| | | |
|---|---|---|
| JP | 2009-534870 A | 9/2009 |
| TW | 201126572 A | 8/2011 |

OTHER PUBLICATIONS

International Preliminary Report on Patentability dated Jan. 5, 2017, issued in corresponding International Application No. PCT/US2014/044595, 10 pages.
International Search Report and Written Opinion dated Mar. 26, 2015, issued in corresponding International Application No. PCT/US2014/044595, 13 pages.
Taiwan Office Action and Search Report, dated Jun. 3, 2016, issued in corresponding Taiwan Patent Application No. 104116074.
Taiwan 3rd Office Action and Search Report, dated Jun. 3, 2017, issued in corresponding Taiwan Patent Application No. 104116074, 7 pages.
Office Action dated Apr. 17, 2018 for Japanese Patent Application o. 2016-567913, 13 pages.

* cited by examiner

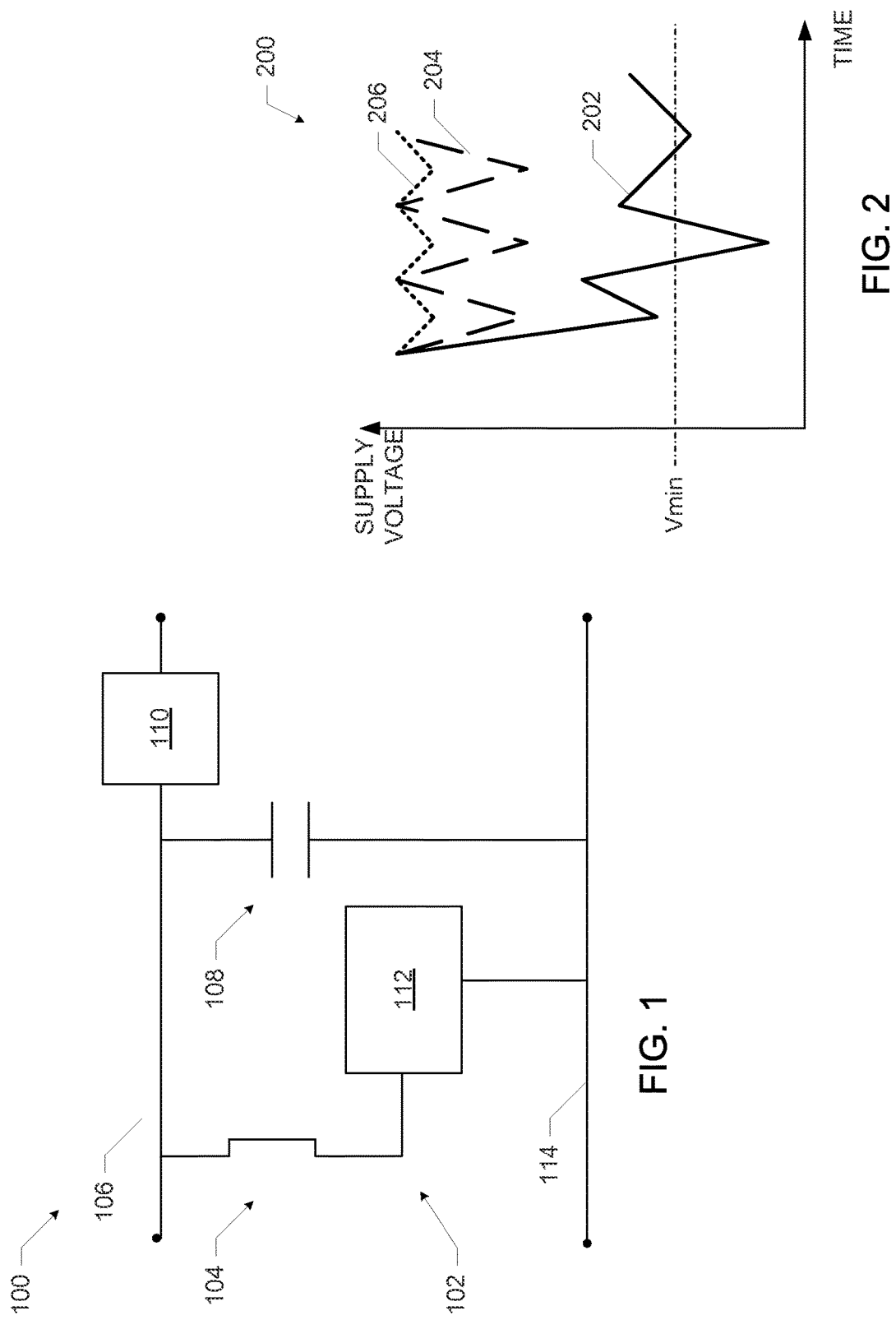

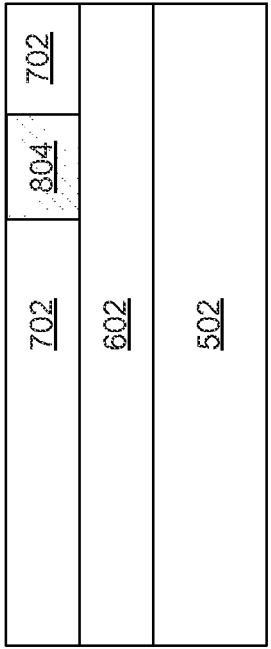
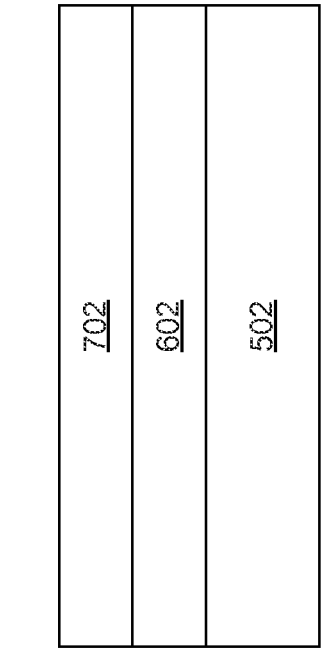

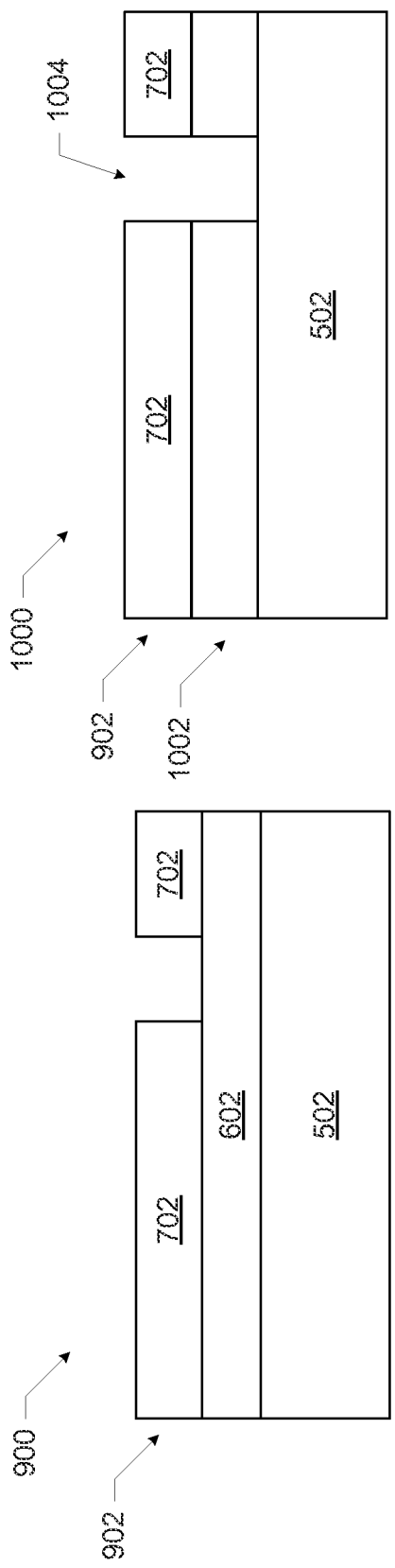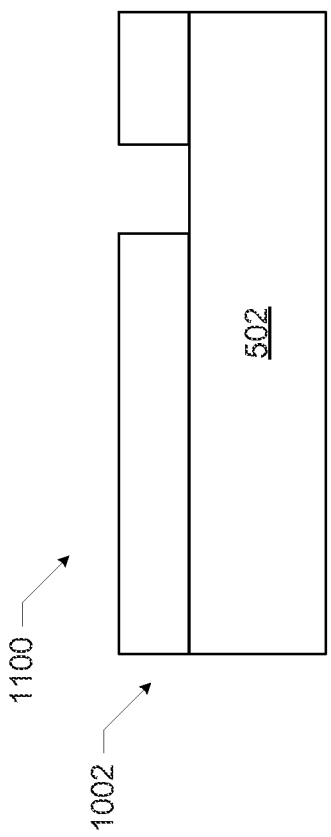

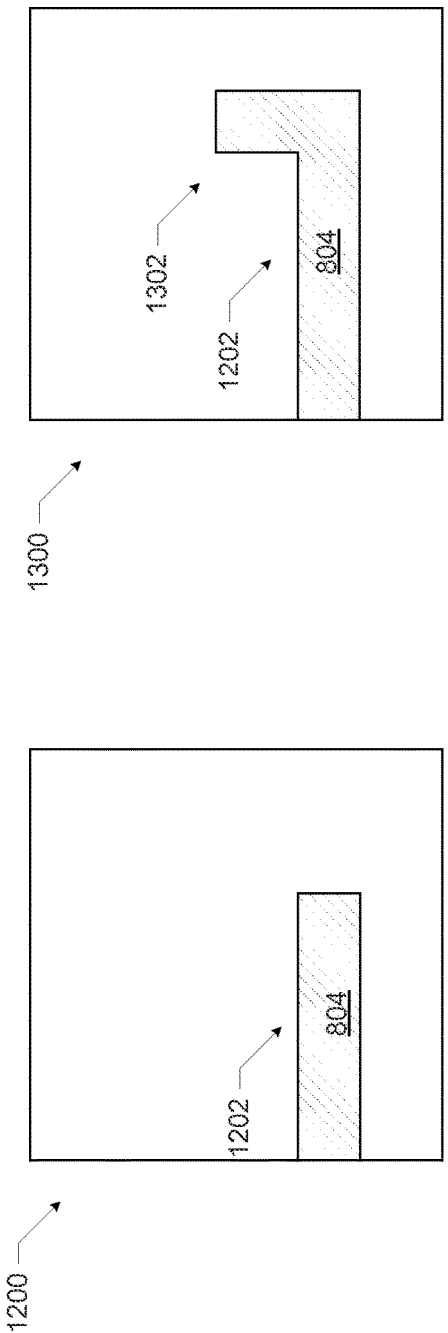

DECOUPLING CAPACITORS AND ARRANGEMENTS

CROSS-REFERENCE TO RELATED APPLICATION

The present application is a national phase entry under 35 U.S.C. § 371 of International Application No. PCT/US2014/044595, filed Jun. 27, 2014, entitled "DECOUPLING CAPACITORS AND ARRANGEMENTS," which designates the United States of America, the entire disclosure of which is hereby incorporated by reference in its entirety and all purposes.

TECHNICAL FIELD

The present disclosure relates generally to the field of integrated circuit devices, and more particularly, to decoupling capacitors and arrangements.

BACKGROUND

Some conventional integrated circuit (IC) devices may include decoupling capacitors to provide quick charge to an electrical load upon a switching event or in response to a group in the supply voltage. However, conventional capacitor structures and arrangements may not be quick enough or strong enough to prevent performance degradation. Conventional approaches may be particularly inadequate with newer transistor structures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a schematic illustration of a portion of an integrated circuit (IC) device having a transistor assembly and a voltage supply, in accordance with various embodiments.

FIG. 2 is a graph depicting the effect of various decoupling capacitors, in accordance with various embodiments.

FIGS. 5-11 depict side, cross-sectional views of various assemblies subsequent to operations in the manufacture of a capacitor in a transistor assembly, in accordance with various embodiments.

FIGS. 12-14 depict top views of various assemblies subsequent to various stages in the formation of the exposed photoresist layer using an electron beam direct write technique, in accordance with various embodiments.

DETAILED DESCRIPTION

Figure 3:
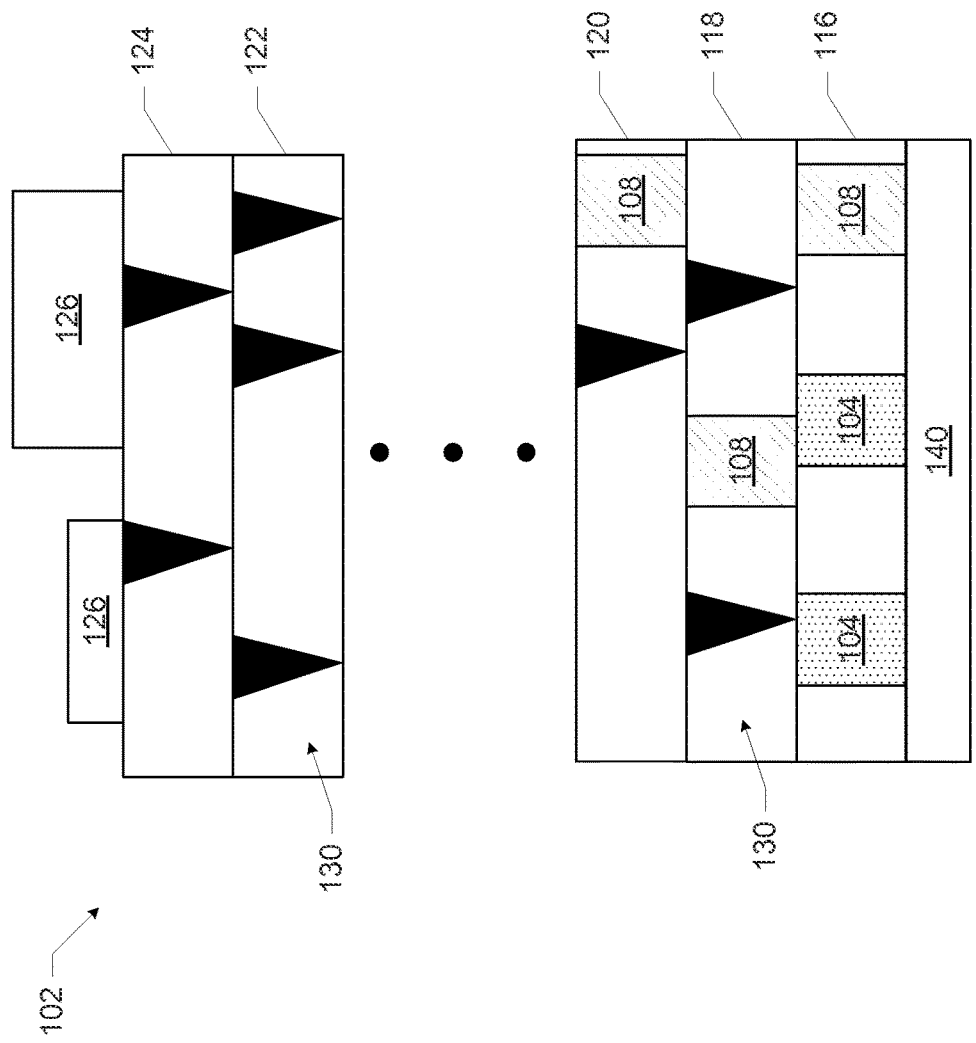
FIG. 3 is a side, cross-sectional view of a transistor assembly, in accordance with various embodiments.

Various embodiments of transistor assemblies, integrated circuit (IC) devices, and related methods are disclosed herein. In some embodiments, a transistor assembly may include a base layer in which a transistor is disposed, a first metal layer, and a second metal layer disposed between the base layer and the first metal layer. The transistor assembly may also include a capacitor disposed in the base layer or the second metal layer and coupled to a supply line of the transistor.

Some of the embodiments disclosed herein may provide quicker and/or stronger charge redistribution to the loads in an IC device than conventional approaches. In particular, some of the embodiments disclosed herein may provide capacitor structures and arrangements with a high stored charge density per unit area and a short pathway over which stored charge may be delivered to a load. Some of the embodiments disclosed herein may provide capacitor structures and arrangements that effectively block noise from reaching the supply line of a transistor, and efficiently transfer power between the capacitor and the load.

Various ones of the embodiments disclosed herein may enable effective decoupling of loads including transistors with tri-gate structures, in a manner not achievable by conventional approaches. Decoupling performance may be a function of the ratio of the capacitance of the decoupling capacitor ("the decoupling capacitance") to the total gate capacitance of the load transistors that are to be decoupled from the supply. The gate capacitance of a transistor may be the net capacitance between the gate of the transistor and other points in the transistor. A first-order contributor to gate capacitance may be the gate to channel capacitance, while second order contributors may be the gate to source capacitance and the gate to drain capacitance, for example. Higher values of the ratio between the decoupling capacitance and the gate capacitance may correspond to improved performance.

Relative to conventional transistor structures, tri-gate transistors may have a significantly higher gate capacitance (due to, e.g., the surface areas of the "vertical walls" acting as capacitor plates). In some scenarios, the gate capacitance of a tri-gate transistor may be approximately twice as high as the gate capacitance of a conventional planar transistor. Thus, decoupling capacitors with significantly higher capacitances may be needed to effectively decouple tri-gate transistors, relative to the decoupling capacitors adequate for conventional planar transistors. Some conventional capacitor structures, such as those that utilize a conventional diffusion-based transistor as a capacitor by coupling the drain and source to form one terminal and using the gate as the other terminal, may provide far too little charge storage to act as an effective decoupler (e.g., by an order of magnitude).

Without adequate decoupling capacitors, droops in the supply voltage (e.g., abnormal instantaneous drops, sometimes caused by switching events) may reach the supply line. The larger the droop, the greater the risk for performance degradation. Examples of performance degradation may include a slower logic response and/or a corruption in the operation of the IC device. Some previous approaches have simply increased the operating voltage of the IC device (e.g., the DC voltage provided by a voltage supply) to reduce the likelihood that the droop will drop below a minimum threshold for effective device performance. However, such approaches result in unnecessary power dissipation, and may not be adequately efficient.

Various ones of the embodiments disclosed herein may provide capacitors capable of storing charge at a high density (and thereby having a high capacitance) so as to achieve a sufficient decoupling capacitance to gate capacitance ratio. Various embodiments also include arrangements of such capacitors proximate to the transistors to which the capacitors are coupled, enabling quick delivery of charge and thereby minimizing droop and its attendant performance degradation. These benefits may be achieved without having to raise the operating voltage of the device and incur excess power costs.

In the following detailed description, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous.

FIG. 1 is a schematic illustration of a portion of an IC device 100 having a transistor assembly 102 and a voltage supply 110, in accordance with various embodiments. The transistor assembly 102 may include a transistor 104 having a supply line 106, and a capacitor 108 coupled to the supply line 106 of the transistor 104. In some embodiments, the transistor 104 may be a driver transistor, and a load 112 may be coupled between the driver transistor 104 and the ground 114. In various embodiments, the load 112 may include one or more "receiving" transistors and/or other devices. In particular, in some embodiments, the transistor 104 may be coupled between the supply line 106 and the gates of transistors in the load 112.

The capacitor 108 may also be coupled to the voltage supply 110. In particular, the capacitor 108 may be coupled to both the supply line 106 of the transistor 104 and the voltage supply 110 in order to act as a charge reservoir between the voltage supply 110 and the transistor 104. Although only a single capacitor 108 is shown in FIG. 1, this is simply for ease of illustration. In various embodiments, the IC device 100 may include multiple capacitors configured as discussed herein for the capacitor 108 to serve as decoupling capacitors. Except for the transistor assembly teachings provided herein, the arrangement of the components of the IC device 100 of FIG. 1 may be conventional. Additionally, although only a single transistor 104 is shown in FIG. 1, this is simply for ease of illustration. In various embodiments, the IC device 100 may include multiple transistors configured as discussed herein for the transistor 104 (e.g., to serve as driver transistors for various loads). In some embodiments, the transistor 104 and/or the load 112 may include a tri-gate transistor, having a substantially "vertical" construction.

FIG. 2 is a graph 200 depicting the effect that the capacitor 108 may have in decoupling the voltage supply 110 and the supply line 106, in accordance with various embodiments. The graph 200 illustrates a scenario in which the voltage 202 provided by the voltage supply 110 may fluctuate. As shown, the voltage 202 may dip below a threshold voltage Vmin, which may represent a voltage at which the operation of the IC device 100 may fail or be compromised if that voltage is provided to the supply line 106 of the transistor 104. Including one or more capacitors 108, providing a first total decoupling capacitance, may insulate the supply line 106 from variations in the voltage 202 so that the supply line 106 is provided with the voltage 204. Increasing the total decoupling capacitance (e.g., by increasing the capacitance of individual capacitors 108 and/or by adding additional capacitors 108 to the IC device 100) may improve decoupling performance so that the supply line 106 is provided with the voltage 206. The effect of the capacitor 108 may be to reduce the likelihood that the voltage seen at the supply line 106 will dip below the threshold voltage Vmin, and thus improve performance and reliability of the IC device 100.

In various embodiments disclosed herein, the transistor assembly 102 may include a base layer in which the transistor 104 is disposed, a first metal layer, and a second metal layer disposed between the base layer and the first metal layer. The capacitor 108 of the transistor assembly 102 may include a sheet of conductive material having one or more channels therein, disposed in the base layer or the second metal layer, and coupled to the supply line 106 of the transistor 104.

An example of such a transistor assembly 102 is illustrated in FIG. 3. In particular, FIG. 3 is a side, cross-sectional view of the transistor assembly 102, in accordance with various embodiments. As shown, the transistor assembly 102 may form a portion of an IC die.

The transistor assembly 102 may include a base layer 116 in which one or more transistors 104 are disposed. As shown, the base layer 116 may include one or more capacitors 108, coupled to one or more of the transistors 104 in the base layer 116. In some embodiments, a capacitor 108 included in the base layer 116 may be located in areas designed, but not used, for transistors. For example, in some embodiments, the base layer 116 may include one or more transistor sites that are unoccupied by transistors. Such sites may be the result of a design construction that typically uses a high percentage of available base-layer sites, but does not fully utilize all available sites. Conventionally, such unoccupied sites may be back-filled with bonus cells (for opportunistic design modifications at a later time) or are "dummy-filled" to provide smooth structures at various layers. Structures included in unoccupied sites may be defined at the design stage (prior to delivering the design to a fabrication facility) and included in the design database as design polygon. As is conventional for base layers, the base layer may be formed on a semiconductor substrate 140 (e.g., a silicon wafer).

A metal layer M_1 118 may be disposed on the base layer 116, and may include one or more conductive portions 130 arranged to couple electrical signals between the base layer 116 and other layers in the transistor assembly 102. The metal layer M_1 118 may be the closest metal layer to the base layer 116. As shown, the metal layer M_1 118 may include one or more capacitors 108, coupled to one or more of the transistors 104 in the base layer 116. A metal layer M_2 120 may be disposed on the metal layer M_1 118, and may include one or more conductive portions 130 arranged to couple electrical signals between various layers of the transistor assembly 102. As shown, the metal layer M_2 120 may include one or more capacitors 108, coupled to one or more of the transistors 104 in the base layer 116.

Any desired number of metal layers may be included in the transistor assembly 102. A number N of metal layers is illustrated in FIG. 3, including the metal layer M_N−1 122 and the metal layer M_N 124. The metal layer M_N 124 may be the outermost metal layer of the die including the transistor assembly 102. The transistor assembly 102 may also include various IC components 126 disposed on the metal layer M_N 124. The IC components 126 may include components that are too large to be disposed "farther down" in the stack. For example, metal-insulator-metal (MIM) capacitors may be disposed on the metal layer M_N 124, and are typically too large by several orders of magnitude to be practically located farther down in the stack (where "real estate" is at a premium and large structures cannot be accommodated). The IC components 126 may include packaged components, such as packaged capacitors.

Although FIG. 3 illustrates capacitors 108 disposed in the base layer 116, the metal layer M_1 118, and the metal layer M_2 120, various embodiments of the transistor assemblies disclosed herein may include capacitors 108 in some, all, or none of these layers. For example, in some embodiments, one or more capacitors 108 may be included in the base layer 116, and may or may not be included in any other layers. In some embodiments, one or more capacitors 108 may be included in the metal layer M_1 118, and may or may not be included in any other layers. In some embodiments, one or more capacitors 108 may be included in the metal layer M_2 120, and may or may not be included in any other layers. In some embodiments, one or more capacitors 108 may be included in other layers between the metal layer M_2 120 and the metal layer M_N 124.

In some embodiments, it may be advantageous to locate a capacitor 108 as close as practicable to the transistor 104 to which it is coupled. Thus, it may be advantageous to include a capacitor 108 in the "lowest" levels of the stack as possible. In some embodiments, a capacitor 108 may be closer to the base layer 116 than to the metal layer M_N 124. This may enable the capacitor 108 to supply charge to the transistor 104 more quickly than could be achieved by a capacitor using components added at much higher levels of integration, such as package capacitors or MIM capacitors. In some embodiments, charge may be supplied approximately 10 times faster by a capacitor 108 disposed in the base layer 116 than could be supplied by packaged or MIM capacitors disposed on the metal layer M_N 124.

Figure 4:
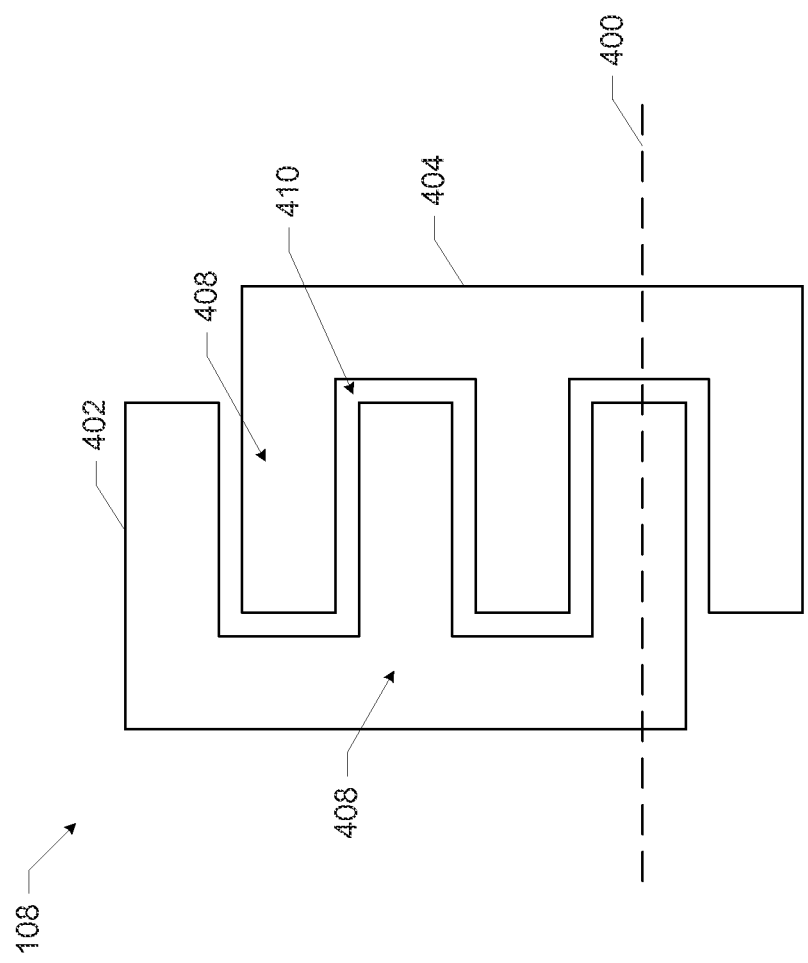
FIG. 4 depicts a top view of an example substantially planar configuration for a capacitor in a transistor assembly, in accordance with various embodiments.

As noted above, some embodiments of the capacitor 108 may provide high density charge storage with a small form factor that is suitable for inclusion at lower levels in a device stack. FIG. 4 depicts a top view of an example substantially planar configuration for the capacitor 108, in accordance with various embodiments. As shown, the capacitor 108 may include a first conductive portion 402 and a second conductive portion 404 spaced apart by a channel 410. As used herein, a "channel" in a conductive material may refer to a gap or other opening in the conductive material that separates the conductive material into two or more portions, allowing each portion to maintain a different electric potential and thus enabling an electric field to be formed between the portions. The first conductive portion 402 may be spaced away from the second conductive portion 404 by the channel 410 to enable the formation of an electric field between the portions 402 and 404 when the portions 402 and 404 experience voltage difference. In some embodiments, the channel 410 may be filled with a dielectric or other material conventionally used between the plates of a capacitor. Each of the portions 402 and 404 may include a plurality of fingers 408, and the fingers 408 of the first conductive portion 402 may be interleaved with the fingers 408 of the second conductive portion 404. The number of fingers 408, the relative dimensions of the portions 402 and 404, and the width and shape of the channel 410 are simply illustrative, and may be selected in accordance with the available footprint for the capacitor 108, the available thickness for the capacitor 108, the desired capacitance of the capacitor 108, and any other conventional design parameter or constraint. For example, various embodiments of the capacitor 108 may have a thickness between approximately 1 micron and approximately 10 microns. In some embodiments, the footprint of the capacitor 108 may be between approximately 1 micron by 1 microns and approximately 10 microns by 10 microns. In some embodiments, multiple capacitors like the capacitor 108 of FIG. 4 may be formed from a sheet of conductive material by surrounding each capacitor with a channel that provides a gap between adjacent capacitors.

FIGS. 5-11 depict side, cross-sectional views of various assemblies subsequent to operations in the manufacture of the capacitor 108 in the transistor assembly 102, in accordance with various embodiments. In particular, FIGS. 5-11 illustrate various assemblies in the manufacture of the embodiment of the capacitor 108 illustrated in top view in FIG. 4. The cross-sectional views of FIGS. 5-11 are taken along the section 400 of the capacitor 108 of FIG. 4. The use of the particular configuration of FIG. 4 to illustrate various manufacturing operations is simply illustrative, and the manufacturing operations discussed below with reference to FIGS. 5-11 may be used to form any desired configuration of the capacitor 108.

FIG. 5 depicts an assembly 500 subsequent to providing layer 502 on which the capacitor 108 is to be disposed. In some embodiments, the layer 502 may be a semiconductor substrate (e.g., a substrate on which the base layer 116 may be formed), the base layer 116, or any metal layer located suitably close to the base layer 116 to provide advantageous decoupling performance.

FIG. 6 depicts an assembly 600 subsequent to depositing a conductive sheet 602 on the layer 502 of the assembly 500. Any suitable technique may be used for conductive material deposition to form the conductive sheet 602, such as physical vapor deposition, atomic layer deposition, electron beam deposition. The conductive material used for the conductive sheet 602 may be any suitable conductive material. For example, the conductive sheet 602 may be a metal sheet. In some such embodiments, the metal may be a same metal as conventionally used to form transistor gates, for example.

FIG. 7 depicts an assembly 700 subsequent to depositing unexposed photoresist material 702 on the conductive sheet 602 of the assembly 600. Any suitable photoresist may be used to provide the unexposed photoresist material 702, such as polymethyl methacrylate (PMMA) or any other conventional photoresist (e.g., those used for electron beam lithography, extreme ultraviolet lithography, or optical lithography).

FIG. 8 depicts an assembly 800 subsequent to selectively exposing the unexposed photoresist material 702 of the assembly 700. The exposed photoresist layer 802 may include unexposed photoresist material 702 and exposed photoresist material 804. In some embodiments, conventional lithography may be used to form the exposed photoresist layer 802. In some embodiments, an electron beam direct write technique may be used to form the exposed photoresist layer 802. In particular, an electron beam direct write technique may be used to form interleaved non-touching conductive structures to form precise, tight-pitched capacitors, as discussed further herein. In some embodiments, a standard lithography technique may be used to form the exposed photoresist layer 802 (e.g., a mask may be applied, followed by laser light, followed by removal of the mask).

FIG. 9 depicts an assembly 900 subsequent to removing the exposed photoresist material 804 from the assembly 800 to form a patterned photoresist layer 902.

FIG. 10 depicts an assembly 1000 subsequent to patterning the conductive sheet 602 of the assembly 900, in accordance with the pattern of the patterned photoresist layer 902, to form the patterned conductive sheet 1002. The patterning of the conductive sheet 602 may form a channel 1004 in the conductive sheet 602. The patterned conductive sheet 1002 may take the form of the capacitor 108, and thus may be patterned in any manner suitable for forming a desired configuration of the capacitor 108. In particular, the channel 1004 may have any suitable shape or width, and may be one of multiple channels formed within the conductive sheet 602 to provide one or more capacitors.

FIG. 11 depicts an assembly 1100 subsequent to removing the patterned photoresist layer 902 from the assembly 1000. As discussed above, the patterned conductive sheet 1002 may take the form of the capacitor 108.

As noted above, in some embodiments, an electron beam direct write technique may be used to pattern the unexposed photoresist material disposed on a conductive sheet in order to ultimately pattern the conductive sheet itself. No mask may be required; instead, the pattern may be formed directly in the photoresist material. Electron beam direct write techniques may also enable the patterning of lines separated by less than 22 nanometers, performance not readily achievable by standard lithography techniques. Reducing the separation of conductive portions in a capacitor structure minimizes the distance between capacitor "plates," and thereby increases the capacitance. The plate separation achieved in conventional capacitor designs may be grossly inadequate to effectively decouple high capacitance transistors (such as tri-gate transistors) from a voltage supply. Thus, utilizing techniques that enable small plate separation may be important to achieving the high capacitances required for effective decoupling.

FIGS. 12-14 depict top views of various assemblies subsequent to various stages in the formation of the exposed photoresist layer using an electron beam direct write technique, in accordance with various embodiments. FIG. 12 depicts an assembly 1200 subsequent to exposing a first portion 1202 of unexposed photoresist material (e.g., the unexposed photoresist material 702 of the assembly 700 of FIG. 7) to form the exposed photoresist material 804. FIG. 13 depicts an assembly 1300 subsequent to exposing a second portion 1302 of unexposed photoresist material of the assembly 1200 to form the exposed photoresist material 804. FIG. 14 depicts an assembly 1400 subsequent to exposing a third portion 1402 of unexposed photoresist material of the assembly 1300 to form the exposed photoresist material 804. Each of the portions 1202, 1302, and 1402 may correspond to the location of a channel in the conductive sheet 602, forming the capacitor 108. The operations illustrated by FIGS. 12-14 may be repeated, rearranged, and adjusted as desired to form a patterned photoresist layer that may be used to pattern a metal layer with channels to form the capacitor 108.

Figure 15:
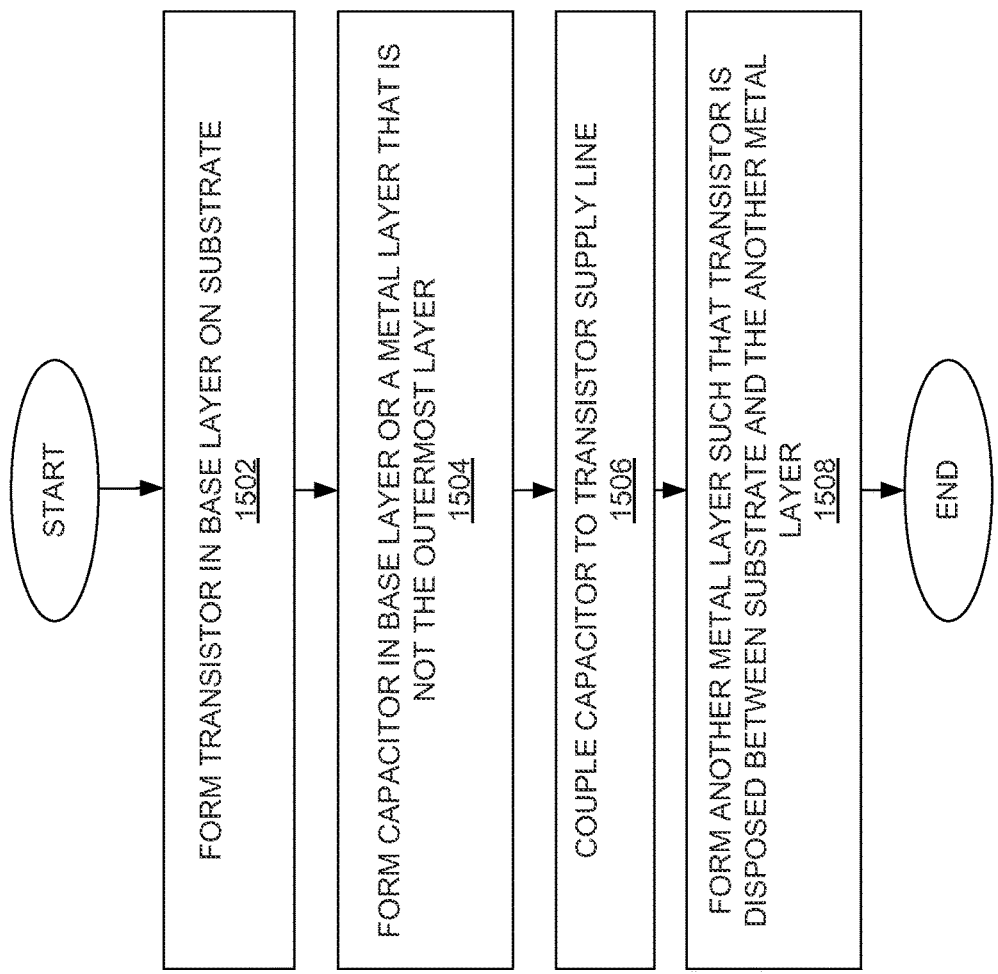
FIG. 15 is a flow diagram of a method of forming a transistor assembly, in accordance with various embodiments.

FIG. 15 is a flow diagram of a method 1500 of forming a transistor assembly, in accordance with various embodiments. The operations of the method 1500 may be discussed below with reference to the transistor assembly 102, but this is simply for ease of illustration and the method 1500 may be applied so as to form any suitable transistor assembly. In some embodiments, the method 1500 may be performed to manufacture an IC device included in the computing device 1600 discussed below with reference to FIG. 16. Various operations of the method 1500 may be repeated, rearranged, or omitted as suitable.

At 1502, a transistor may be formed in a base layer on a substrate. The transistor may have a supply line. For example, the transistor 104 may be formed in the base layer 116 on the substrate 140, and may have a supply line 106. In some embodiments, the transistor of 1502 may be a tri-gate transistor.

At 1504, a capacitor may be formed in the base layer or in a metal layer. The metal layer may be a metal layer that is not the outermost metal layer. For example, the capacitor 108 may be formed in the base layer 116, the metal layer M_1 118, the metal layer M_2 120, or any other suitable layer "farther down" in the stack from the outermost metal layer M_N 124. In some embodiments, forming the capacitor at 1504 may include patterning channels in a conductive sheet (e.g., as discussed above with reference to FIGS. 5-11). In some embodiments, patterning channels in a conductive sheet may include using an electron beam direct write technique (e.g., as discussed above with reference to FIGS. 12-14). In some embodiments, a plurality of capacitors may be formed at 1504. The plurality of capacitors may be located in the base layer and/or any other metal layer that is not the outermost metal layer.

At 1506, the capacitor of 1504 may be coupled to the supply line of the transistor of 1502. For example, the capacitor 108 may be coupled to the supply line 106 of the transistor 104.

At 1508, another metal layer may be formed such that the capacitor of 1504 may be disposed between the substrate at 1502 and the another metal layer. In some embodiments, the another metal layer may be an outermost metal layer (e.g., the metal layer M_N 124). In some embodiments, the another metal layer may be an "intermediate" metal layer (e.g., any of the metal layers M_1 118 to M_N−1 122). In some embodiments, the capacitor of 1504 may be formed before the another metal layer of 1508 is formed.

Figure 16:
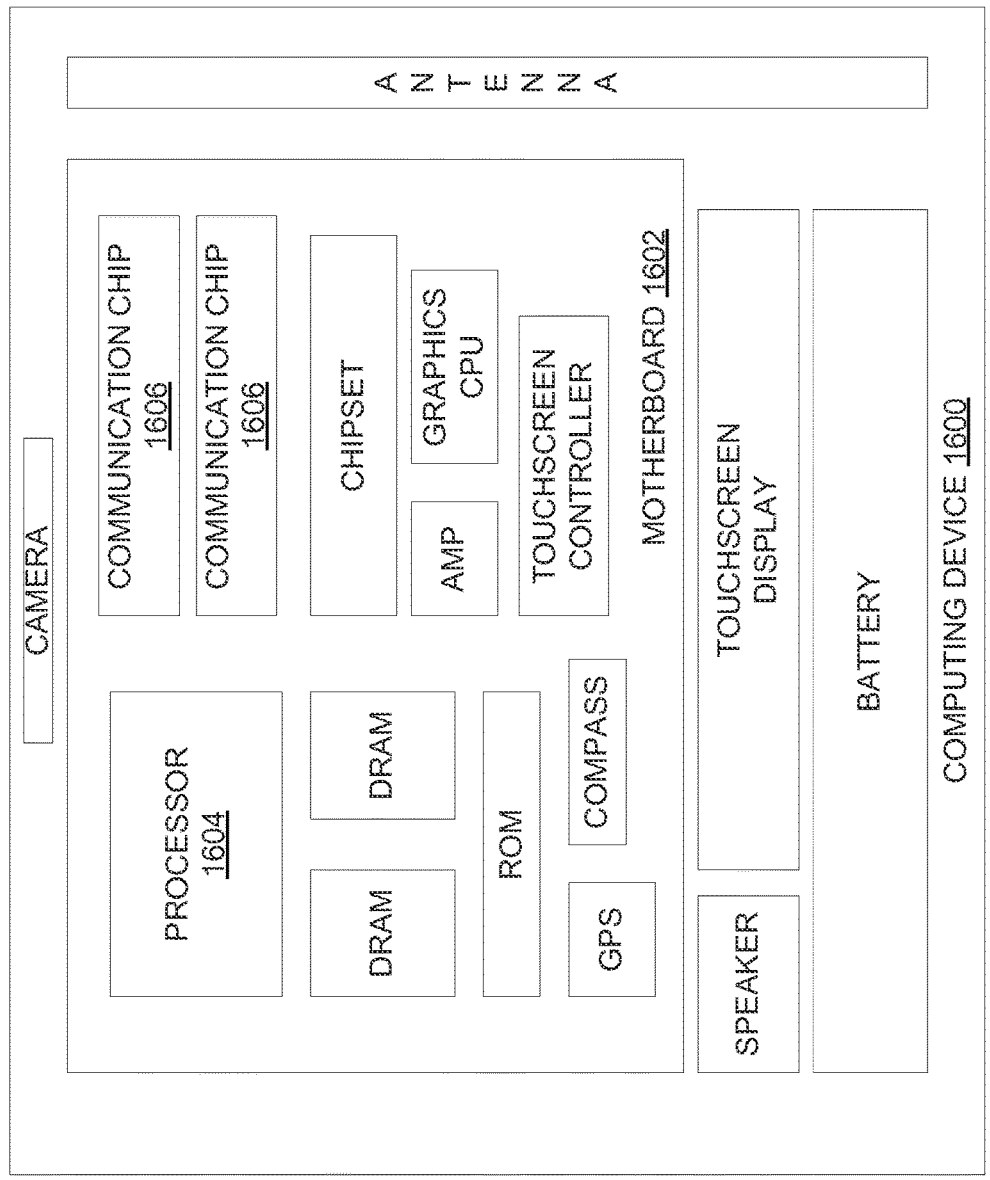
FIG. 16 schematically illustrates a computing device that may include one or more transistor assemblies as disclosed herein, in accordance with various embodiments.

FIG. 16 schematically illustrates a computing device 1600 that may include one or more of the transistor assemblies 102 disclosed herein, in accordance with various embodiments. In particular, various dies including any suitable ones of the components of the computing device 1600 may include a transistor assembly (e.g., the transistor assembly 102) as disclosed herein.

The computing device 1600 may house a board such as motherboard 1602. The motherboard 1602 may include a number of components, including but not limited to a processor 1604 and at least one communication chip 1606. The processor 1604 may be physically and electrically coupled to the motherboard 1602. In some implementations, the at least one communication chip 1606 may also be physically and electrically coupled to the motherboard 1602. In further implementations, the communication chip 1606 may be part of the processor 1604. The term "processor"

may refer to any device or portion of a device that processes electronic data from registers and/or memory to transform that electronic data into other electronic data that may be stored in registers and/or memory.

Depending on its applications, computing device 1600 may include other components that may or may not be physically and electrically coupled to the motherboard 1602. These other components may include, but are not limited to, volatile memory (e.g., dynamic random access memory), non-volatile memory (e.g., read-only memory), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as 3GPP2), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1606 may operate in accordance with other wireless protocols in other embodiments.

The computing device 1600 may include a plurality of communication chips 1606. For instance, a first communication chip 1606 may be dedicated to shorter range wireless communications such as Wi-Fi and Bluetooth, and a second communication chip 1606 may be dedicated to longer range wireless communications such as GPS, EDGE, GPRS, CDMA, WiMAX, LTE, EV-DO, and others.

The communication chip 1606 may also include an IC package assembly that may include a transistor assembly (e.g., the transistor assembly 102) as described herein. In further implementations, another component (e.g., memory device, processor, or other integrated circuit device) housed within the computing device 1600 may contain a transistor assembly (e.g., the transistor assembly 102) as described herein.

In various implementations, the computing device 1600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data. In some embodiments, the techniques described herein are implemented in a high-performance computing device. In some embodiments, the techniques described herein are implemented in handheld computing devices. In some embodiments, the techniques described herein may be implemented in a wearable computing device.

The following paragraphs provide a number of examples of the embodiments disclosed herein. Example 1 is a transistor assembly, including: a base layer in which a transistor is disposed, wherein the transistor has a supply line; a first metal layer; a second metal layer disposed between the base layer and the first metal layer; and a capacitor, a sheet of conductive material having a channel therein, disposed in the base layer or the second metal layer and coupled to the supply line of the transistor.

Example 2 may include the subject matter of Example 1, and may further specify that: the first metal layer is an outermost metal layer of a die; and the capacitor is closer to the base layer than to the first metal layer.

Example 3 may include the subject matter of any of Examples 1-3, and may further specify that the capacitor is coupled to a voltage supply of the IC assembly.

Example 4 may include the subject matter of any of Examples 1-3, and may further specify that the capacitor is disposed in the base layer.

Example 5 may include the subject matter of any of Examples 1-4, and may further specify that the transistor is a tri-gate transistor.

Example 6 may include the subject matter of any of Examples 1-5, and may further specify that the second metal layer is a metal layer closest to the base layer.

Example 7 may include the subject matter of any of Examples 1-6, and may further specify that the capacitor is substantially planar and has interleaved fingers.

Example 8 may include the subject matter of any of Examples 1-7, and may further specify that the conductive material is a metal.

Example 9 is an IC device, including a transistor assembly and a voltage supply. The transistor assembly includes a base layer in which a transistor is disposed, wherein the transistor has a supply line, a first metal layer, a second metal layer disposed between the base layer and the first metal layer, and a capacitor, including a sheet of conductive material having a channel therein, disposed in the base layer or the second layer. The capacitor is coupled to the voltage supply and to the transistor supply line.

Example 10 may include the subject matter of Example 9, and may further specify that the capacitor is disposed in the base layer.

Example 11 may include the subject matter of any of Examples 9-10, and may further specify that the transistor is a tri-gate transistor.

Example 12 may include the subject matter of any of Examples 9-11, and may further specify that the capacitor is substantially planar and has interleaved fingers.

Example 13 may include the subject matter of any of Examples 9-12, and may further specify that the transistor is a driver transistor, and wherein the base layer further comprises a plurality of load transistors coupled to the driver transistor.

Example 14 is a method of forming a transistor assembly, including: forming a transistor in a base layer on a substrate, wherein the transistor has a supply line; forming a capacitor in the base layer or a second metal layer by selectively patterning a sheet of conductive material; coupling the capacitor to the transistor supply line; and forming a first metal layer such that the capacitor is disposed between the substrate and the first metal layer.

Example 15 may include the subject matter of Example 14, and may further specify that the conductive material is metal.

Example 16 may include the subject matter of any of Examples 14-15, and may further specify that selectively patterning the conductive sheet comprises using an electron beam direct write technique.

Example 17 may include the subject matter of any of Examples 14-15, and may further specify that selectively patterning the conductive sheet comprises using an extreme ultraviolet lithography technique.

Example 18 may include the subject matter of any of Examples 14-17, and may further specify that forming the capacitor in the base layer or the second metal layer is performed prior to forming the first metal layer.

Example 19 may include the subject matter of any of Examples 14-18, and may further specify that forming the transistor comprises forming a tri-gate transistor.

Example 20 may include the subject matter of any of Examples 14-19, and may further specify that forming the capacitor in the base layer or the second metal layer comprises forming a plurality of capacitors in the base layer or the second metal layer.

What is claimed is:

1. A transistor assembly, comprising:
   a base layer in which a transistor is included, wherein the transistor has a supply line;
   a first metal layer;
   a second metal layer between the base layer and the first metal layer; and
   a capacitor, comprising a sheet of conductive material having a channel therein, wherein the capacitor is in the base layer or the second metal layer, wherein the capacitor is coupled to the supply line of the transistor, wherein the capacitor is substantially planar and has interleaved fingers spaced apart by the channel, and wherein the interleaved fingers include a first set of interleaved fingers that form a first capacitor plate and a second set of interleaved fingers that form a second capacitor plate.

2. The transistor assembly of claim 1, wherein:
   the first metal layer is an outermost metal layer of a die; and
   the capacitor is closer to the base layer than to the first metal layer.

3. The transistor assembly of claim 1, wherein the capacitor is coupled to a voltage supply of the transistor assembly.

4. The transistor assembly of claim 1, wherein the capacitor is in the base layer.

5. The transistor assembly of claim 1, wherein the transistor is a tri-gate transistor.

6. The transistor assembly of claim 1, wherein the capacitor is entirely in the second metal layer, and wherein the second metal layer is a metal layer closest to the base layer.

7. The transistor assembly of claim 1, wherein the capacitor is substantially planar and has interleaved fingers spaced apart by the channel.

8. The transistor assembly of claim 1, wherein the conductive material is metal.

9. The transistor assembly of claim 1, wherein the capacitor is in the second metal layer and over the transistor.

10. An integrated circuit (IC) device, comprising:
    a transistor assembly, comprising:
        a base layer in which a transistor is included, wherein the transistor has a supply line,
        a first metal layer,
        a second metal layer between the base layer and the first metal layer, and
        a capacitor comprising a sheet of conductive material having a channel therein, wherein the capacitor is in the second metal layer and over the transistor; and
    a voltage supply;
    wherein the capacitor is coupled to the voltage supply and to the transistor supply line.

11. The IC device of claim 10, wherein the capacitor is in the base layer.

12. The IC device of claim 10, wherein the transistor is a tri-gate transistor.

13. The IC device of claim 10, wherein the transistor is a driver transistor, and wherein the base layer further comprises a plurality of load transistors coupled to the driver transistor.

14. The IC device of claim 10, wherein the second metal layer is a metal layer closest to the base layer.

15. A method of forming a transistor assembly, comprising:
    forming a transistor in a base layer on a substrate, wherein the transistor has a supply line;
    forming a capacitor in the base layer or a second metal layer by selectively patterning a sheet of conductive material to form a channel in the sheet of conductive material, wherein the capacitor is substantially planar and has interleaved fingers spaced apart by the channel, and wherein the interleaved fingers include a first set of interleaved fingers that form a first capacitor plate and a second set of interleaved fingers that form a second capacitor plate;
    coupling the capacitor to the transistor supply line; and
    forming a first metal layer such that the capacitor is disposed between the substrate and the first metal layer.

16. The method of claim 15, wherein the conductive material is metal.

17. The method of claim 15, wherein selectively patterning the conductive sheet comprises using an electron beam direct write technique.

18. The method of claim 15, wherein selectively patterning the conductive sheet comprises using an extreme ultraviolet lithography technique.

19. The method of claim 15, wherein forming the capacitor in the base layer or the second metal layer is performed prior to forming the first metal layer.

20. The method of claim 15, wherein forming the transistor comprises forming a tri-gate transistor.

21. The method of claim 15, wherein forming the capacitor in the base layer or the second metal layer comprises forming a plurality of capacitors in the base layer or the second metal layer.

* * * * *